United States Patent
Jenkins, IV (10) Patent No.: US 7,498,839 B1
(45) Date of Patent: Mar. 3, 2009

(54) LOW POWER ZONES FOR PROGRAMMABLE LOGIC DEVICES

(75) Inventor: Jesse H. Jenkins, IV, Danville, CA (US)

(73) Assignee: XILINX, Inc., San Jose, CA (US)

( * ) Notice: Subject to any disclaimer, the term of this patent is extended or adjusted under 35 U.S.C. 154(b) by 140 days.

(21) Appl. No.: 10/971,934

(22) Filed: Oct. 22, 2004

(51) Int. Cl.
- H03K 19/177 (2006.01)
- H03K 19/173 (2006.01)
- H01L 25/00 (2006.01)
- H01L 29/73 (2006.01)
- G06F 7/38 (2006.01)

(52) U.S. Cl. ............... 326/41; 326/37; 326/38; 326/39; 326/40; 326/47; 257/207

(58) Field of Classification Search ............ 326/37–41, 326/47; 257/207; 716/16
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,362,989 A | 11/1994 | Hennedy | |
| 5,519,663 A | 5/1996 | Harper, Jr. et al. | |
| 5,568,062 A | 10/1996 | Kaplinsky | |
| 5,583,457 A | 12/1996 | Horiguchi et al. | |
| 5,612,892 A | 3/1997 | Almulla | |
| 5,615,162 A | 3/1997 | Houston | |
| 5,671,149 A | 9/1997 | Brown | |
| 5,682,107 A | 10/1997 | Tavana et al. | |
| 5,712,790 A | 1/1998 | Ditlow et al. | |
| 5,801,548 A | 9/1998 | Lee et al. | |
| 5,811,962 A | 9/1998 | Ceccherelli et al. | |
| 5,825,662 A | 10/1998 | Trimberger | |
| 5,832,286 A | 11/1998 | Yoshida | |
| 5,914,873 A | 6/1999 | Blish, II | |
| 5,946,257 A | 8/1999 | Keeth | |
| 5,958,026 A | 9/1999 | Goetting et al. | |
| 6,038,386 A | 3/2000 | Jain | |
| 6,114,843 A | 9/2000 | Olah | |
| 6,148,390 A | 11/2000 | MacArthur et al. | |
| 6,160,418 A * | 12/2000 | Burnham | 326/38 |
| 6,169,419 B1 | 1/2001 | De et al. | |
| 6,172,518 B1 | 1/2001 | Jenkins, IV. et al. | |
| 6,208,171 B1 | 3/2001 | Kumagai et al. | |
| 6,466,049 B1 | 10/2002 | Diba et al. | |
| 6,489,804 B1 * | 12/2002 | Burr | 326/38 |

(Continued)

OTHER PUBLICATIONS

Texas Instruments—Datasheet BQ4011 (32Kx8 nonvolatile SRAM) Sep. 5, 1999. pp. 1-10.*

(Continued)

*Primary Examiner*—Rexford Barnie
*Assistant Examiner*—Dylan White
(74) *Attorney, Agent, or Firm*—William L. Paradice, III; John J. King (57) ABSTRACT

An integrated circuit device such as a PLD is divided into a plurality of logic blocks, each including one or more resources of the device. The device includes a plurality of switch elements and a number of signal isolation circuits. The switch elements selectively disable corresponding logic blocks to reduce power consumption, and the signal isolation circuits selectively isolates corresponding logic blocks to prevent the transmission of invalid data from disabled logic blocks to enabled logic blocks.

41 Claims, 7 Drawing Sheets

U.S. PATENT DOCUMENTS

| | | | |
|---|---|---|---|
| 6,583,645 B1* | 6/2003 | Bennett et al. | 326/41 |
| 6,631,502 B2 | 10/2003 | Buffet et al. | |
| 6,710,621 B2 | 3/2004 | Devlin et al. | |
| 6,711,719 B2* | 3/2004 | Cohn et al. | 716/2 |
| 6,747,478 B2* | 6/2004 | Madurawe | 326/39 |
| 6,885,563 B2 | 4/2005 | Panella et al. | |
| 6,920,627 B2 | 7/2005 | Blodget et al. | |
| 6,936,917 B2 | 8/2005 | Lopata et al. | |
| 6,950,998 B1 | 9/2005 | Tuan | |
| 6,968,467 B2 | 11/2005 | Inoue et al. | |
| 7,003,620 B2 | 2/2006 | Avraham et al. | |
| 7,078,932 B2 | 7/2006 | Swami | |
| 7,080,341 B2 | 7/2006 | Eisenstadt et al. | |
| 7,109,748 B1* | 9/2006 | Liu et al. | 326/38 |
| 7,112,997 B1* | 9/2006 | Liang et al. | 326/81 |
| 7,135,886 B2 | 11/2006 | Schlacter | |
| 7,313,708 B2 | 12/2007 | Oshins et al. | |
| 2002/0008542 A1* | 1/2002 | Tsai et al. | 326/82 |
| 2003/0030326 A1 | 2/2003 | Shenai et al. | |
| 2003/0173993 A1* | 9/2003 | Gupta | 326/41 |
| 2003/0218478 A1 | 11/2003 | Sani et al. | |
| 2004/0145955 A1 | 7/2004 | Mizuno et al. | |
| 2005/0040851 A1* | 2/2005 | New | 326/41 |
| 2005/0091547 A1 | 4/2005 | Hanrieder et al. | |
| 2005/0201174 A1 | 9/2005 | Klein | |
| 2005/0237083 A1* | 10/2005 | Bakker et al. | 326/47 |
| 2006/0053246 A1 | 3/2006 | Lee | |
| 2006/0069851 A1 | 3/2006 | Chung et al. | |
| 2006/0202713 A1* | 9/2006 | Shumarayev | 326/38 |
| 2007/0001720 A1 | 1/2007 | Li et al. | |
| 2007/0164785 A1 | 7/2007 | He | |

OTHER PUBLICATIONS

U.S. Appl. No. 10/666,669, Tuan et al., filed Sep. 19, 2003.
U.S. Appl. No. 10/783,216, Tuan et al., filed Feb. 20, 2004.
U.S. Appl. No. 10/783,589, Look et al., filed Feb. 20, 2004.
U.S. Appl. No. 10/606,619, New et al., filed, Jun. 26, 2003.
Mutoh, Shin'Chiro et al., "1-V Power Supply High-speed Digital Circuit Technology with Multithreshold-Voltage CMOS", IEEE Journal Of Solid-state Circuits, Aug. 1995, pp. 847-854, vol. 30, No. 8, available from IEEE, 3 Park Avenue, 17th Floor, New York, NY 10016-5997.
Inukai, T. et al., "Boosted Gate MOS (BGMOS): Device/Circuit Cooperation scheme to Achieve Leakage-Free Giga-Scale Integration" IEEE 2000 Custom Intergrated Circuits Conference, May 21-24, 2000, pp. 409-412, available from IEEE, 3 Park Avenue, 17th Floor, New York, NY 10016-5997.
Kuroda, Tadahiro et al., "A 0.9-V, 150-MHz, 10-mW, 4 mm², 2-D Discrete Cosine Transform Core Processor With Variable Threshold-voltage (VT) Scheme", Nov. 1996, pp. 1770-1779, vol. 32, No. 11, available from IEEE, 3 Park Avenue, 17th Floor, New York, NY 10016-5997.
Hamzaoglu, Faith et al., "Circuit-Level Techniques to Control Gate Leakage for Sub-100nm CMOS", ISLPED, Aug. 12-14, 2002, pp. 60-63, available from IEEE, 3 park Avenue, 17th Floor, New York, NY 10016-5997.
He, Lei, "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http://eda.ee.ucla.edu/.
FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.
Takahashi, M. et al., "A 60-mW MPEG4 Video Codec Using Clustered Voltage Scaling with variable Supply-Voltage Scheme," Nov. 1998, pp. 1772-1780, vol. 33, No. 11 available from IEEE Journal of Solid-State Circuits, IEEE, 3 Park Avenue, 17th Floor, New York, NY 10016-5997.
Park, Jae Y., Allen, Mark G., "A Comparison of Micromachined Inductors with Different Magnetic Core Materials"; 1996 Electronic Components and technology Conference; 1996 IEEE; pp. 375-381.
Burd, THomas D., et al., "A Dynamic Voltage Scaled Microprocessor System"; 2000 IEEE; IEEE Journal of Solid-State Circuits, vol. 35, No. 11, Nov. 2000; pp. 1571-1580.
Stratakos, Anthony J., et al., "A Low-Voltage CMOS DC-DC Converter for a Portable Battery-Operated System"; 1994 IEEE; Jun. 20-25, 1994, pp. 619-626.
Stratakos, Anthony John, "High-Efficiency Low-Voltage DC-DC Conversion for Portable Applications,"πChapter 3; "DC-DC Converter Fundamentals"; Ph. D. dissertation, UC, Berkeley, CA 1999, pp. 42-78. Month N/A.
Allen/Holberg; Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.
Microship Technology Inc.; "Micropower Voltage Supervisors"; MCP102/103/121/131; Copyright 2005; downloaded on Jan. 3, 2006 from ww1.microship.com/downloads/en/DeviceDoc/21906b.pdf; pp. 1-28.
Xilinx, Inc.; "Virtex-II Pro Paltfrom FPGA Handbook"; published Oct. 14, 2002; available from Xilinx, Inc., 2100 Logic Drive, San Jose, California 95124; pp. 19-71.
Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.-3L.
Intel Corporation, "intel PXA27x Processor Family Power Requirements", Application Norte, 2004, pp. 1-36, available from Intel Corporation (Santa Clara) Corporate Office, 2200 Mission College Blvd., Santa Clara, California 95052-8119. MOnth N/A.
Nowka, Kevin J., A 32-bit PowerPC System-on-a-Chip With Support For Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.
U.S. Appl. No. 11/268,265 filed Nov. 4, 2005, Rahman, Arifur, et al. entitled "Implementation of Low Power Standby Modes For Integrated Circuits", Xilinx, Inc., San Jose, CA.
U.S. Appl. No. 11/325,888 filed Jan. 4, 2006, Tuan, Tim, entitled "Programmable Low Power Modes For Embedded Memory Blocks", Xilinx Inc., San Jose, CA.
U.S. Appl. No. 11/326,542 filed Jan. 04, 2006, Jacobson, Neil G. et al., entitled "Method and Mechanism for Controlling Power Consumption of an Integrated Circuit", Xilinx, Inc., San Jose, CA.
U.S. Appl. No. 11/329,646 filed Jan. 11, 2006, Jenkins, Jesse H. IV, entitled "Programmable Detection of Power Failure in an Integrated Circuit", Xilinx, Inc., San Jose, CA.
U.S. Appl. No. 11/502,939 filed Aug. 11, 2006, Tuan, Tim, et al., entitled "Disabled Unused/Inactive Resources in Programmable Logic Devices for Static Power Reduction", Xilinx Inc., San Jose, CA.
US 6,981,160, 12/2005, Thaker et al. (withdrawn)

* cited by examiner

LOW POWER ZONES FOR PROGRAMMABLE LOGIC DEVICES

CROSS-REFERENCE TO RELATED APPLICATIONS

This application is related to co-pending and commonly-owned U.S. patent application Ser. No. 10/666,669 entitled "Disabling Unused/Inactive Resources In Programmable Logic Devices For Static Power Reduction" filed Sep. 19, 2003; U.S. patent application Ser. No. 10/783,216 entitled "Tuning Programmable Logic Devices For Low-Power Design Implementation" filed Feb. 20, 2004, and U.S. patent application Ser. No. 10/783,589 entitled "Regulating Unused/Inactive Resources In Programmable Logic Devices For Static Power Reduction" filed Feb. 20, 2004, all of which are incorporated herein by reference.

FIELD OF INVENTION

This invention relates generally to power supply distribution in integrated circuit (IC) devices, and in particular to selectively providing power to various portions of an IC device.

DESCRIPTION OF RELATED ART

A programmable logic device (PLD) is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data.

PLDs such as FPGA devices typically exhibit greater static power consumption than dedicated logic devices such as standard-cell application specific integrated circuits (ASICs). One reason for the PLD's high power consumption is because while the PLD utilizes only a subset of its available resources for any given design, the unused resources nevertheless consume static power. As a result, PLDs are sometimes not suitable for low-power applications such as, for example, portable devices.

To reduce power consumption, some PLDs include circuitry that selectively de-couples unused or inactive resources of the PLD from the voltage supply to disable the inactive resources, for example, as described in the patent applications referenced above. However, if the inactive resources are de-coupled from the voltage supply during PLD operation, resulting leakage currents in the disabled resources may cause internal logic nodes therein to discharge toward ground potential, which in turn may cause data signals at one or more outputs of the disabled resources to have indeterminate or invalid logic states. If provided to the enabled (e.g., active) resources of the PLD, these invalid data signals may drive logic elements in the enabled resources to invalid states, and thereby cause the enabled resources to function improperly.

Therefore, there is a need to disable unused or inactive resources of a PLD to reduce power consumption without adversely affecting operation of the enabled resources.

SUMMARY

A method and apparatus are disclosed that may significantly reduce static power consumption in an integrated circuit (IC) device such as a PLD by disabling unused or inactive resources without adversely affecting operation of the enabled resources. In accordance with the present invention, unused and/or inactive resources of the device may be disabled to reduce power consumption and then isolated from enabled (e.g., active) resources of the device to prevent invalid data signals from propagating from the disabled resources to the enabled resources.

For some embodiments, the device's resources are divided into a plurality of logic blocks that may be selectively disabled and isolated from each other. For one embodiment, each logic block is selectively coupled to a voltage supply by a corresponding switch element, and is selectively coupled to one or more other logic blocks by one or more corresponding signal isolation circuits. The switch elements and the signal isolation circuits may be controlled using corresponding power control and signal isolation control signals provided by an isolation control circuit. For one embodiment, asserting a power control signal turns on a switch element to enable the corresponding logic block, de-asserting the power control signal turns off the switch element to disable the logic block, asserting a signal isolation control signal turns on a signal isolation circuit to facilitate the exchange of data signals between the logic block and other device resources, and de-asserting the signal isolation control signal turns off the signal isolation circuit to prevent the exchange of data signals between the logic block and other device resources. In this manner, the signal isolation circuits may isolate disabled logic blocks from enabled logic blocks to prevent the transmission of invalid data signals from disabled logic blocks to enabled logic blocks.

For some embodiments, the logic blocks may be disabled by de-coupling the logic blocks from a voltage supply. For other embodiments, the logic blocks may be disabled by regulating (e.g., reducing) a supply voltage applied to the logic blocks.

The control signals may be stored in the isolation control circuit and/or be provided to the control circuit as user-generated control signals. For example, if certain resources of the device are inactive for a predetermined time period, the user-controlled signals may be activated to disable and/or isolate the inactive resources. For embodiments in which the device is a PLD, the control signals may be configuration bits that are stored in the isolation control circuit during configuration of the PLD.

For other embodiments, the device may include a non-volatile memory to store configuration data for the logic blocks, and also include a configuration control circuit that provides configuration data to one or more logic blocks that have been disabled and subsequently re-enabled. In this manner, the re-enabled logic blocks may be re-configured using configuration data stored within the device when they are re-enabled for operation, thereby eliminating the need to re-configure the device from an external source.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of an exemplary PLD architecture for simplicity only. It is to be understood that present embodiments are equally applicable to other PLD architectures such as FPGAs and complex PLDs, and to other types of integrated circuits including, for example, application-specific integrated circuit (ASIC) devices. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Additionally, the interconnection between circuit elements or blocks may be shown as buses or as single signal lines. Each of the buses may alternatively be a single signal line, and each of the single signal lines may alternatively be a bus. Accordingly, the present invention is not to be construed as limited to specific examples described herein but rather includes within its scope all embodiments defined by the appended claims.

Figure 1:
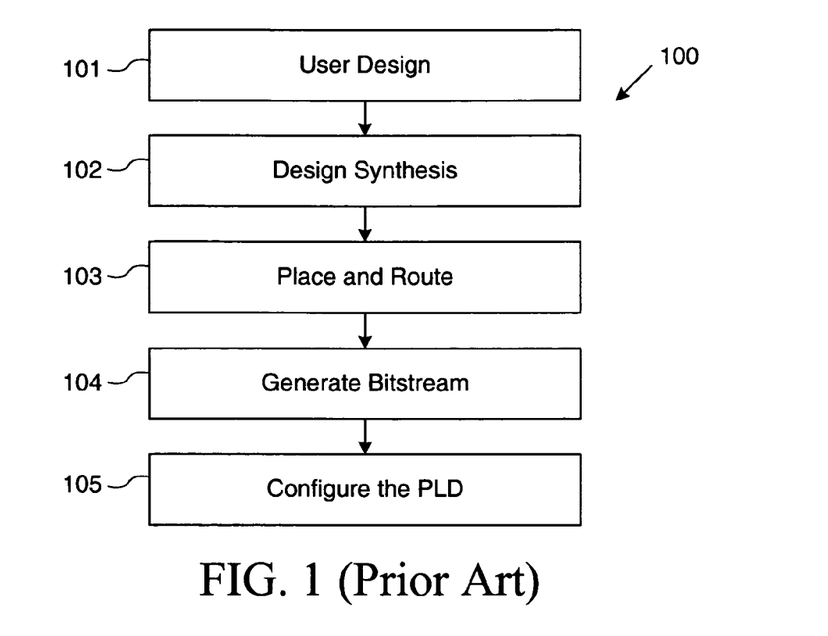
FIG. 1 is a flow diagram illustrating a conventional design flow used for a PLD.

FIG. 1 is a flow diagram 100 illustrating a conventional design flow used for PLDs. Initially, a user designs a circuit to be implemented by the PLD (Step 101). This user design is described in a high-level specification, such as Verilog or VHDL. The high-level specification is first synthesized to basic logic cells available on the PLD (Step 102). A place and route process then assigns every logic cell and wire in the design to some physical resource in the PLD (Step 103). The design is then converted into a configuration bit stream, in a manner known to those of ordinary skill in the art (Step 104). The configuration bit stream is then used to configure the device by setting various on-chip configuration memory cells (Step 105). While modern design flows may be much more complex, they all involve the basic steps defined by flow diagram 100.

For some embodiments of the present invention, unused resources of the PLD may be identified during the design time, following the place and route process (Step 103). These unused resources may be then selectively disabled during the design time.

Figure 2:
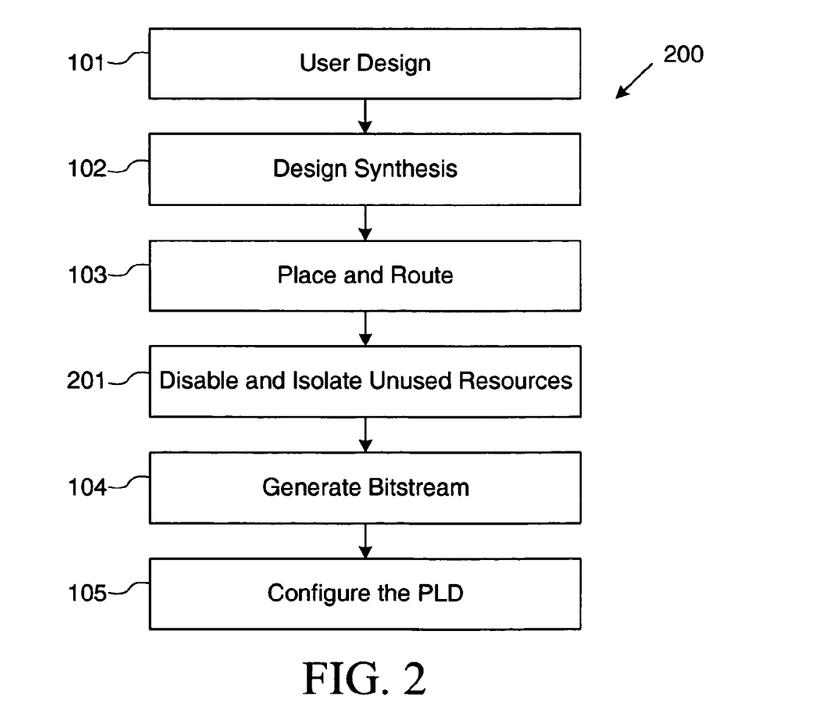
FIG. 2 is a flow diagram illustrating a design flow for a PLD in accordance with one embodiment of the present invention.

For example, FIG. 2 is a flow diagram 200 illustrating a design flow in accordance with one embodiment of the present invention, where similar steps in flow diagrams 100 and 200 are labeled with similar reference numbers. Thus, flow diagram 200 includes Steps 101-105 of flow diagram 100, as described above. In addition, flow diagram 200 includes the step of disabling unused resources in the PLD (Step 201). This step of disabling unused resources is performed after the place and route process has been completed in Step 103, and before the configuration bit stream is generated in Step 104. By selectively disabling the unused resources at design time, significant static power reduction may be achieved with no performance penalty.

For other embodiments, further power savings may be achieved by disabling temporarily inactive resources of the configured PLD during run time. Often, the entire design or parts of the design are temporarily inactive for some period of time. If the inactive period is sufficiently long, it may be desirable to disable the inactive resources to reduce power consumption. For one embodiment, the decision of when to disable a temporarily inactive resource may be made by the designer, for example, by allowing user logic to access a disabling mechanism that dynamically disables the inactive resources.

Figure 3:
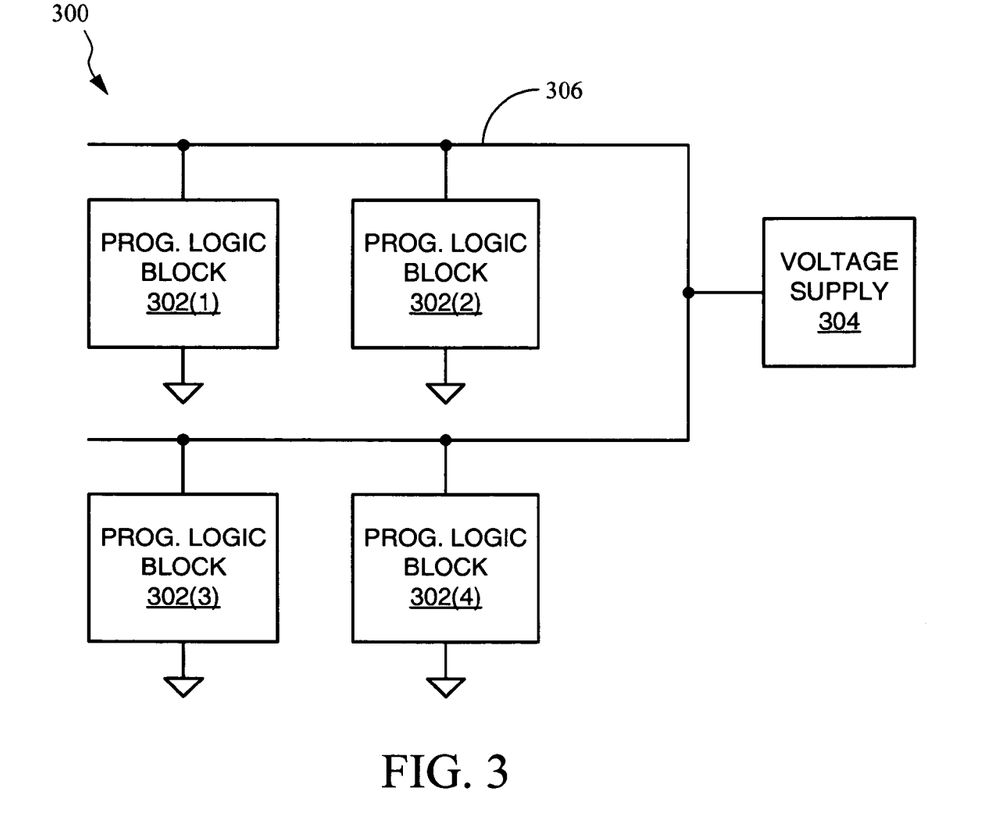
FIG. 3 is a block diagram of a conventional PLD logically subdivided into four programmable logic blocks.

To implement embodiments of the present invention in an IC device such as a PLD, the PLD is logically subdivided into a plurality of separate programmable logic blocks, each of which may include one or more of the resources available on the PLD. For example, FIG. 3 is a block diagram of a PLD 300 having four programmable logic blocks 302(1)-302(4), each of which is connected to a voltage supply 304 via a power rail 306. Voltage supply 304, which powers all programmable logic blocks 302(1)-302(4) with a supply voltage (VDD), may be implemented either on-chip or off-chip.

In accordance with the present invention, a PLD having a plurality of logically defined programmable logic blocks also includes a plurality of switch elements and a number of signal isolation circuits. Each switch element is coupled between a corresponding programmable logic block and the voltage supply, and performs a power-gating function to disable unused and/or inactive programmable logic blocks to reduce power consumption. The signal isolation circuits are coupled to corresponding signal lines of the programmable logic blocks, and perform a signal gating function to isolate disabled programmable logic blocks from enabled programmable logic blocks, thereby preventing the transmission of invalid data signals from disabled programmable logic blocks to enabled programmable logic blocks.

Figure 4:
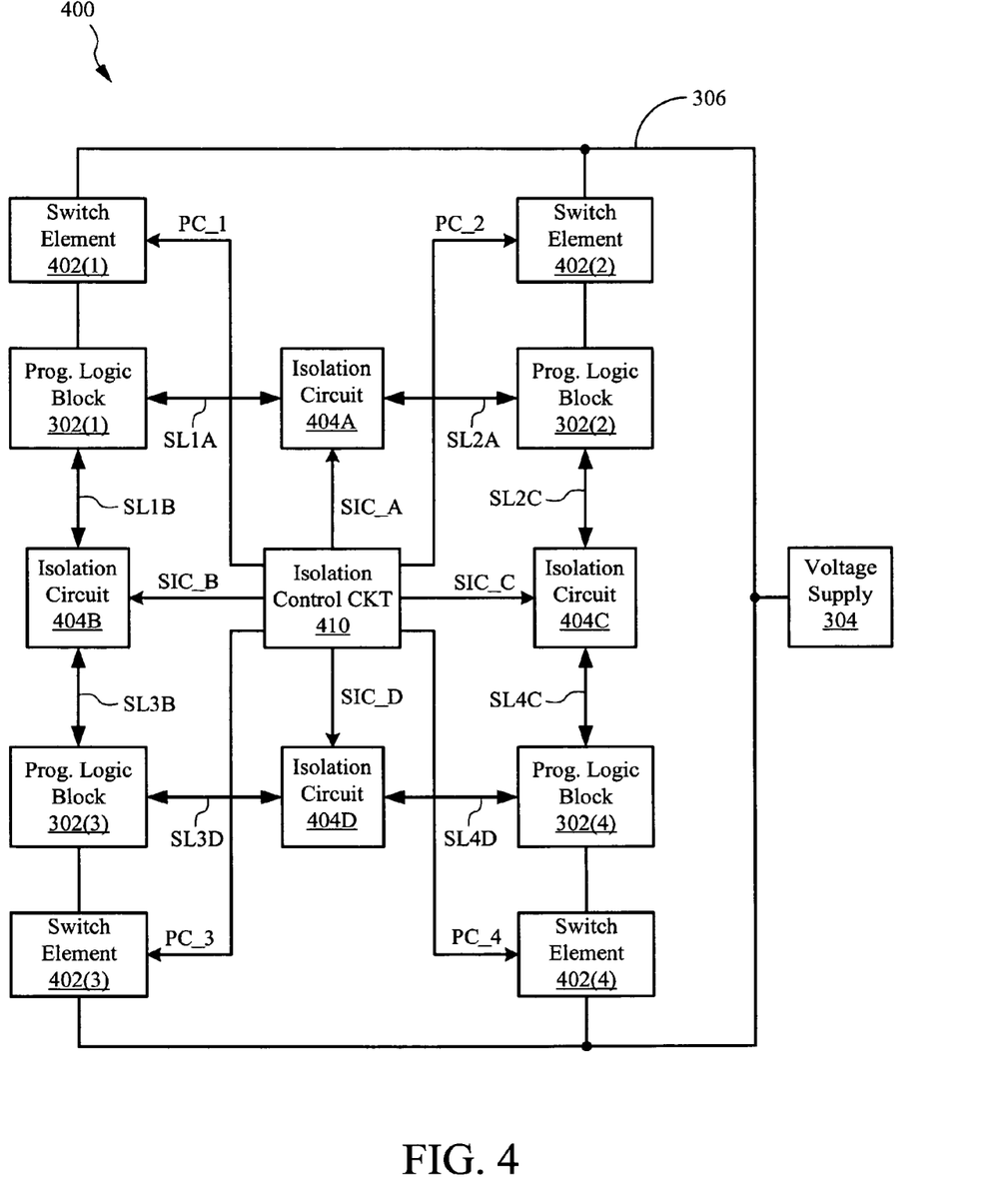
FIG. 4 is a block diagram of a PLD having four logically defined programmable logic blocks that may be selectively disabled and isolated from other programmable logic blocks in accordance with one embodiment of the present invention.

For example, FIG. 4 is a block diagram of a PLD 400 in accordance with some embodiments of the present invention. PLD 400 includes programmable logic blocks 302(1)-302(4), voltage supply 304, power rail 306, switch elements 402(1)-402(4), isolation circuits 404A-404D, and an isolation control circuit 410. For the exemplary embodiment of FIG. 4, PLD 400 includes four programmable logic blocks 302(1)-302(4), four corresponding switch elements 402(1)-402(4), and associated signal isolation circuits 404A-404D. For other embodiments, PLD 400 may include any suitable number of programmable logic blocks 302, corresponding switch elements 402, and associated signal isolation circuits 404.

The granularity of the programmable logic blocks may range from arbitrarily small circuits to significant portions of the PLD. The logically defined size of each programmable logic block 302 may be determined by the desired trade-off between power savings, layout area overhead of switch elements 402, signal isolation circuits 404, and control circuit 410, and speed penalties. For example, in an FPGA device, each programmable logic block 302 may be selected to include one or more configuration logic blocks (CLBs), input/output blocks (IOBs), and/or other resources of the FPGA (such as block RAM, processors, multipliers, adders, transceivers).

Each switch element 402 is coupled between power rail 306 and a corresponding programmable logic block 302, and is configured to selectively couple the corresponding programmable logic block 302 to voltage supply 304 via power rail 306 in response to a corresponding power control signal PC provided by isolation control circuit 410. For example, when control signal PC_1 is asserted (e.g., to logic high), switch element 402(1) couples programmable logic block 302(1) to voltage supply 304, thereby enabling programmable logic block 302(1) for normal operation. When control signal PC_1 is de-asserted (e.g., to logic low), switch element 402(1) de-couples programmable logic block 302(1) from voltage supply 304, thereby disabling programmable logic block 302(1) and minimizing its power consumption.

Although not shown in FIG. 4 for simplicity, each programmable logic block 302 may also include a power connection to ground potential. For some embodiments, additional switch elements (e.g., similar to switch elements 402) may be provided to selectively couple corresponding programmable logic blocks 302(1)-302(4) to ground potential in response to the power control signals PC_1 to PC_4.

Switch elements 402(1)-402(4) may be any suitable power gating circuit that selectively connects programmable logic blocks 302 to voltage supply 304. For some embodiments, each switch element 402 may be implemented by a PMOS power-gating transistor connected between power rail 306 and a corresponding programmable logic block 302 and having a gate to receive the corresponding power control signal. Further, for embodiments in which programmable logic blocks 302 are selectively connected to ground potential via additional switch elements (not shown), each additional switch element may be implemented by an NMOS power-gating transistor connected between ground potential and a corresponding programmable logic block 302 and having a gate to receive the corresponding power control signal.

As illustrated in FIG. 4, programmable logic blocks 302 communicate with each other via corresponding signal lines SL, with each signal line SL having one end connected to one or more resources (not shown for simplicity) within a corresponding programmable logic block 302 and having another end connected to a corresponding signal isolation circuit 404. The more or more resources may include various well-known PLD components including, for example, an input or output buffer, an input or output multiplexer in a CLB slice, sequential logic, combinational logic, circuit elements in an IOB, and the like. For simplicity, FIG. 4 shows only one signal line connection between pairs of adjacent programmable logic blocks 302. However, for actual embodiments, corresponding pairs of programmable logic blocks 302 may be connected together by any suitable number of signal line connections or buses. Further, although FIG. 4 shows only signal line connections between pairs of adjacent programmable logic blocks 302, for actual embodiments, PLD 400 may include signal line connections between pairs of non-adjacent programmable logic blocks (e.g., between programmable logic blocks 302(1) and 302(4)).

For the exemplary embodiment of FIG. 4, each signal isolation circuit 404 is coupled between the signal lines SL of a corresponding pair of programmable logic blocks 302, and is configured to selectively allow the transmission of data signals between the programmable logic block pair in response to a corresponding signal isolation control signal SIC. For example, signal isolation circuit 404A includes a first terminal coupled to signal line SL1A of programmable logic block 302(1), a second terminal coupled to signal line SL2A of programmable logic block 302(2), and a control terminal to receive a signal isolation control signal SIC_A provided by isolation control circuit 410. When SIC_A is asserted (e.g., to logic high), signal isolation circuit 404A connects signal lines SL1A and SL2A together to facilitate the exchange of data signals between programmable logic blocks 302(1) and 302(2). When SIC_A is de-asserted (e.g., to logic low), signal isolation circuit 404A isolates signal lines SL1A and SL2A from each other to prevent the exchange of data signals between programmable logic blocks 302(1) and 302(2).

Isolation control circuit 410 is configured to provide the power control signals PC_1-PC_4 to corresponding switch elements 402(1)-402(4) and to provide the signal isolation control signals SIC_1-SIC_4 to corresponding isolation circuits 404A-404D. For some embodiments, control circuit 410 includes a plurality of first memory cells (not shown in FIG. 4 for simplicity) to store the power control signals, and includes a plurality of second memory cells (not shown in FIG. 4 for simplicity) to store the signal isolation control signals. For one embodiment, the power and signal isolation control signals may be included in a configuration bitstream as a plurality of control bits, and stored in corresponding configuration memory cells of isolation control circuit 410 during configuration of PLD 400. For other embodiments, control circuit 410 may include input terminals (not shown in FIG. 4 for simplicity) to receive the power and signal isolation control signals from a user of the PLD and/or from other circuitry of PLD 400.

As discussed above, isolation control circuit 410 may control isolation control circuits to selectively isolate one or more disabled programmable logic blocks 302 from the enabled programmable logic blocks 302 so that indeterminate or invalid logic signals in the disabled programmable logic blocks are not transmitted to the enabled programmable logic blocks. For example, an exemplary operation of one embodiment of PLD 400 is described below with respect to the flow chart of FIG. 5. Initially, PLD 400 may be configured to enable all programmable logic blocks 302(1)-302(4) for normal operation (Step 501). Thus, isolation control circuit 410 asserts all power control signals PC_1-PC_4 to connect all programmable logic blocks to voltage supply 304, and asserts all signal isolation control signals SIC_A-SIC_D so that respective signal isolation circuits 404A-404D enable communication between corresponding pairs of programmable logic blocks 302. Thereafter, a selected programmable logic block 302 is disabled to reduce its power consumption (Step 502). For example, if programmable logic block 302(1) is no longer needed to implement a desired PLD function or has been idle for a predetermined time period, control circuit 410 may disable programmable logic block 302(1) by de-asserting power control signal PC_1, which causes switch element 402(1) to de-couple programmable logic block 302(1) from VDD.

Figure 5:
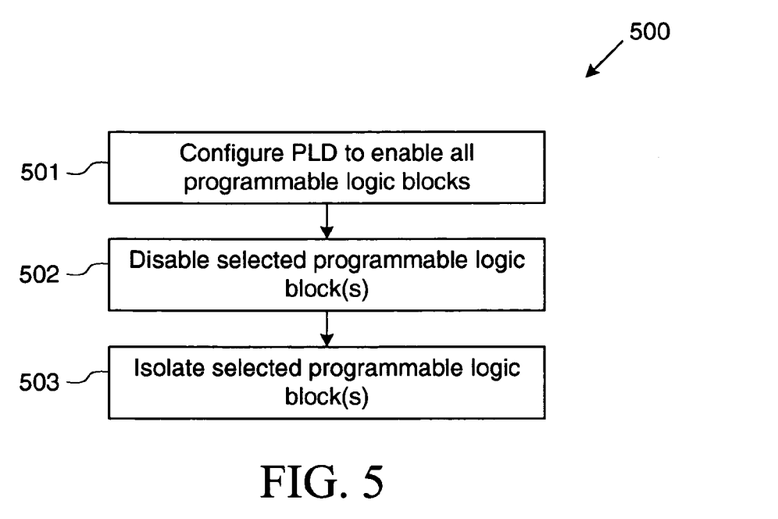
FIG. 5 is a flow diagram illustrating an exemplary operation of one embodiment of the PLD of FIG. 4.

When power is removed from the selected programmable logic block 302(1), logic nodes (not shown for simplicity) within the programmable logic block's resources begin falling towards ground potential. As a result, logic signals present on the programmable logic block's signal lines SL1A and SL1B may drift to indeterminate or invalid logic states, which if transmitted to corresponding enabled programmable logic blocks 302(2) and 302(3), respectively, may cause programmable logic blocks 302(2) and 302(3) to function improperly. Thus, in accordance with the present invention, control circuit 410 isolates the disabled programmable logic block 302(1) from the enabled programmable logic blocks 302(2) and 302(3) (Step 503). More specifically, control circuit 410 de-asserts signal isolation control signals SIC_A and SIC_B. The de-asserted state of SIC_A causes signal isolation circuit 404A to isolate programmable logic block 302(1) from programmable logic block 302(2), and the de-asserted state of SIC_B causes signal isolation circuit 404B to isolate programmable logic block 302(1) from programmable logic block 302(3). In this manner, signal isolation circuits 404A and 404B prevent the transmission of invalid data signals from disabled programmable logic block 302(1) to enabled programmable logic blocks 302(2) and 302(3), respectively.

For some embodiments, isolation control circuit 410 is implemented using available programmable resources of the PLD. For one embodiment, control circuit 410 is implemented within a selected programmable logic block that is designated to remain in an enabled and fully-powered state, irrespective of the control signals. In this manner, control circuit 410 remains operational to control the disabling and isolation of unused or inactive programmable logic blocks.

As described above, switch elements 402 perform a power-gating function by selectively de-coupling corresponding programmable logic blocks from the voltage supply. For other embodiments, switch elements 402 may be replaced by well-known switching regulators (not shown for simplicity) configured to selectively reduce the voltage supplied to unused or inactive programmable logic blocks 302 in response to the power control signals. For one embodiment, the switching regulators may be programmably tuned to provide desired supply voltages to corresponding associated programmable logic blocks 302. For example, a switching regulator may provide a full supply voltage to its corresponding programmable logic block 302 when the programmable logic block is enabled, and may provide a reduced voltage (e.g., some percentage of the supply voltage) to its corresponding programmable logic block when the programmable logic block is disabled. The reduced voltage may be predetermined (e.g., by design or via testing) depending on the desired circuit behavior. For example, the reduced voltage may be the minimum voltage required to maintain the state of the associated programmable logic blocks. Providing a reduced supply voltage to inactive or unused programmable logic blocks may significantly reduce their power consumption.

Figure 6:
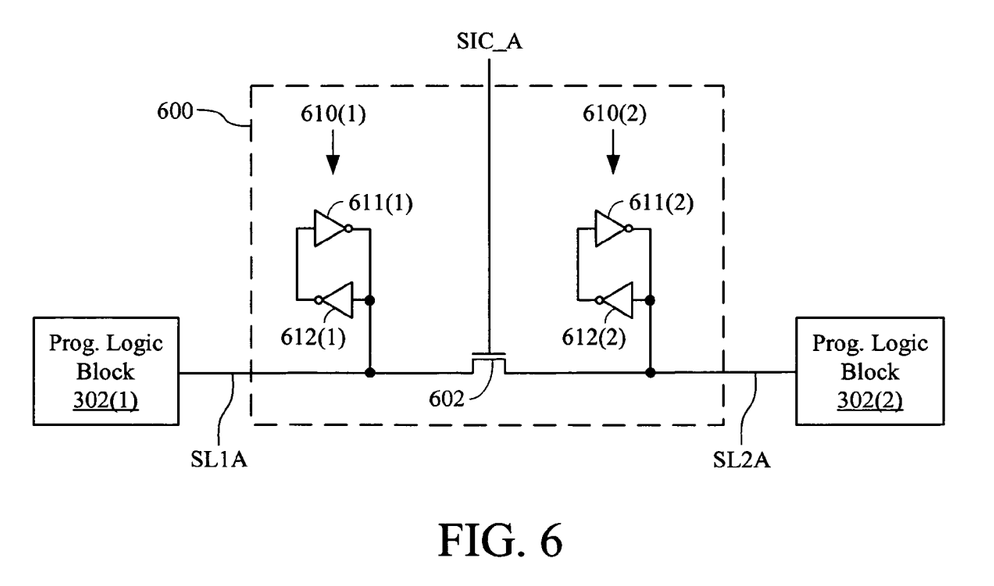
FIG. 6 is a circuit diagram of one embodiment of the signal isolation circuit of FIG. 4.

FIG. 6 shows a signal isolation circuit 600 that is one embodiment of signal isolation circuits 404 of FIG. 4. Signal isolation circuit 600, which for purposes of discussion herein is shown coupled between programmable logic blocks 302(1) and 302(2), includes an NMOS pass transistor 602 and keeper latches 610(1) and 610(2). Pass transistor 602, which for other embodiments may be a PMOS transistor, is coupled between signal line SL1A of programmable logic block 302(1) and signal line SL2A of programmable logic block 302(2), and has a gate to receive signal isolation control signal SIC_A. Keeper latch 610(1), which is implemented in a well-known manner by cross-coupled inverters 611(1) and 612(1), is coupled to signal line SL1A. Keeper latch 610(2), which is implemented in a well-known manner by cross-coupled inverters 611(2) and 612(2), is coupled to signal line SL2A. Keeper latch 610(1) captures and stores the logic state of a data signal on signal line SL1A, and keeper latch 610(2) captures and stores the logic state of a data signal on signal line SL1B.

For other embodiments, keeper latch 610(1) may include a power terminal selectively connected to voltage supply 304 via the switch element (not shown for simplicity) associated with programmable logic blocks 302(1), and keeper latch 610(2) may include a power terminal selectively connected to voltage supply 304 via the switch element (not shown for simplicity) associated with programmable logic blocks 302(2). In this manner, keeper latches 610(1) and 610(2) are powered only when corresponding programmable logic blocks 302(1) and 302(2) are enabled, thereby reducing power consumption of signal isolation circuit 600.

When SIC_A is asserted (e.g., to logic high), pass transistor 602 turns on and connects signal lines SL1A and SL2A together, thereby allowing data signals to be exchanged between programmable logic blocks 302(1) and 302(2). Conversely, when SIC_A is de-asserted (e.g., to logic low), pass transistor 602 turns off and disconnects signal lines SL1A and SL2A from each other, thereby preventing data signals from being exchanged between programmable logic blocks 302(1) and 302(2).

For example, if programmable logic block 302(1) is disabled while programmable logic block 302(2) remains enabled, SIC_A may be de-asserted to turn off pass transistor 602 and thereby isolate signal line SL1A of programmable logic block 302(1) from signal line SL2A of programmable logic block 302(2). Keeper latch 610(1) stores the logic state of the data signal on signal line SL1A prior to the disabling of programmable logic block 302(1), and keeper latch 610(2) maintains the logic state of the data signal on signal line SL2A prior to the disabling of programmable logic block 302(1). Thus, by maintaining the current logic state on signal line SL2A, signal isolation circuit 600 prevents indeterminate or invalid logic signals resulting from the disabling of programmable logic block 302(1) from being transmitted to the enabled programmable logic block 302(2).

Figure 7:
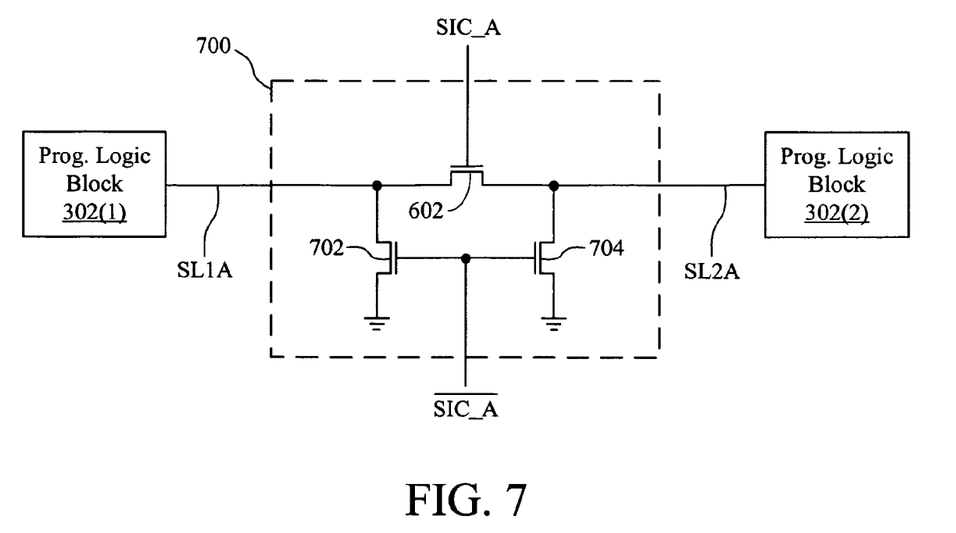
FIG. 7 is a circuit diagram of another embodiment of the signal isolation circuit of FIG. 4.

FIG. 7 shows a signal isolation circuit 700 that is another embodiment of signal isolation circuits 404 of FIG. 4. Signal isolation circuit 700, which for purposes of discussion herein is shown coupled between programmable logic blocks 302(1) and 302(2), includes NMOS pass transistor 602 and NMOS pull-down transistors 702 and 704. Pull-down transistor 702 is coupled between signal line SL1A of programmable logic block 302(1) and ground potential, and has a gate to receive the logical complement of SIC_A (e.g., $\overline{SIC\_A}$). Pull-down transistor 704 is coupled between signal line SL2A of programmable logic block 302(2) and ground potential, and has a gate to receive $\overline{SIC\_A}$.

When SIC_A is asserted (e.g., to logic high), pass transistor 602 turns on and connects signal lines SL1A and SL2A together, thereby allowing data signals to be exchanged between programmable logic blocks 302(1) and 302(2). The resulting logic low state of $\overline{SIC\_A}$ turns off pull-down transistors 702 and 704. Conversely, when SIC_A is de-asserted (e.g., to logic low), pass transistor 602 turns off and disconnects signal lines SL1A and SL2A from each other, thereby preventing data signals from being exchanged between programmable logic blocks 302(1) and 302(2). The resulting logic high state of $\overline{SIC\_A}$ turns on pull-down transistors 702 and 704, thereby discharging signal lines SL1A and SL2A, respectively, to ground potential.

For example, if programmable logic block 302(1) is disabled while programmable logic block 302(2) remains enabled, SIC_A may be de-asserted to turn off pass transistor 602 and thereby isolate signal line SL1A of programmable logic block 302(1) from signal line SL2A of programmable logic block 302(2). The logic high state of $\overline{SIC\_A}$ causes signal lines SL1A and SL2A to discharge to ground potential via pull-down transistors 702 and 704, respectively. In this manner, signal isolation circuit 700 forces a logic zero signal on signal line SL2A of programmable logic block 302(2) when programmable logic block 302(1) is disabled, thereby preventing indeterminate or invalid logic signals resulting from the disabling of programmable logic block 302(1) from being transmitted to the enabled programmable logic block 302(2).

Figure 8:
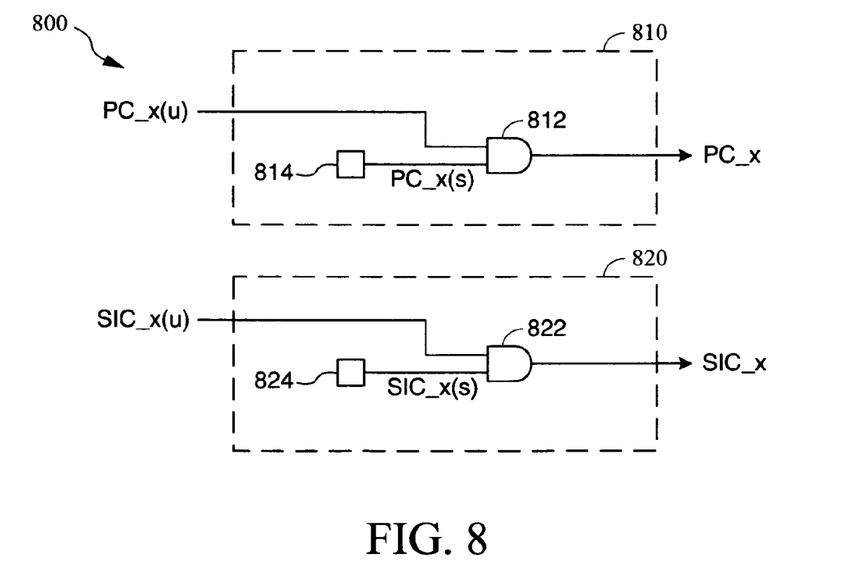
FIG. 8 is a circuit diagram of a portion of one embodiment of the control circuit of FIG. 4.

FIG. 8 shows a portion 800 of a control circuit that is one embodiment of control circuit 410 of FIG. 4. Control circuit 800 includes a first portion 810 for providing a power control signal PC_x to a corresponding switch element, and includes a second portion 820 for providing a signal isolation control signal SIC_x to a corresponding signal isolation circuit (for simplicity, the switch element and signal isolation circuit are not shown in FIG. 8). Portion 810 includes an AND gate 812 having a first input to receive a power control signal PC_x(s) stored in a memory cell 814, a second input to receive a user-generated power control signal PC_x(u), and an output to generate PC_x. Portion 820 includes an AND gate 822 having a first input to receive a signal isolation control signal SIC_x(s) stored in a memory cell 824, a second input to receive a user-generated signal isolation control signal SIC_x(u), and an output to generate SIC_x.

Memory cells 814 and 824 may be any suitable volatile memory element (e.g., a latch, look-up table, or the like) or any non-volatile memory element (e.g., a PROM cell, EPROM cell, EEPROM cell, flash memory, fuse, and the like). The power control signal PC_x(s) and the signal isolation signal SIC_x(s) stored in memory cells 814 and 824, respectively, may be configuration bits extracted from a PLD configuration bitstream during configuration of PLD 400. The power control signal PC_x(u) and the signal isolation signal SIC_x(u) may be control signals provided to control circuit 800 during operation of PLD 400. For some embodiments, PC_x(u) and SIC_x(u) may be user-generated control signals provided, for example, to PLD 400 via one or more corresponding input pads (not shown for simplicity). For other embodiments, PC_x(u) and SIC_x(u) may be control signals provided to control circuit 800 by one or more other resources of the PLD.

Portion 810 asserts PC_x to enable a corresponding programmable logic block if either PC_x(s) or PC_x(u) is asserted, and de-asserts PC_x to disable the corresponding programmable logic block if both PC_x(s) and PC_x(u) are de-asserted. Similarly, portion 820 asserts SIC_x to enable a corresponding programmable logic block to output its data signals if either SIC_x(s) or SIC_x(u) is asserted, and de-asserts SIC_x to isolate the corresponding programmable logic block if both SIC_x(s) and SIC_x(u) are de-asserted. In this manner, the power control signals and the signal isolation control signals may be controlled by the PLD's configuration bits, which are best suited for disabling and isolating unused or inactive programmable logic blocks at design time, or by the externally-generated control signals, which are best suited for disabling and isolating unused or inactive programmable logic blocks during normal PLD operation.

Figure 9:
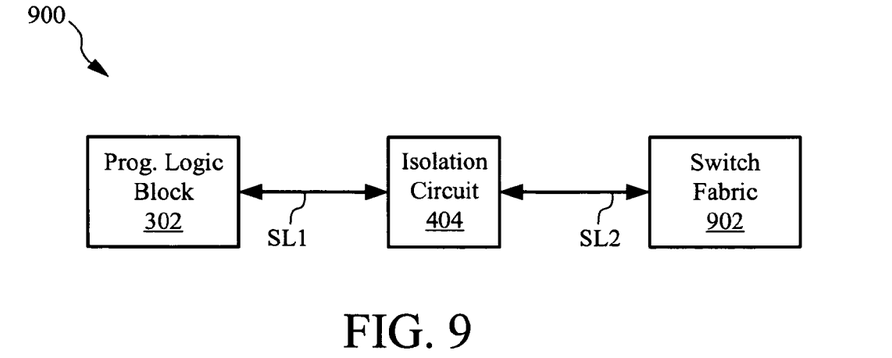
FIG. 9 is a block diagram of a portion of a PLD in accordance with another embodiment of the present invention.

The exemplary embodiments described above with respect to FIG. 4 depict signal isolation circuits 404 connected between corresponding pairs of programmable logic blocks 302. However, for other embodiments, the signal isolation circuits may be connected between corresponding signal lines of a programmable logic block and other PLD elements. For example, FIG. 9 shows a portion 900 of a PLD that is another embodiment of the present invention. Here, signal isolation circuit 404 is connected between programmable logic block 302 and switch fabric 902 via signal lines SL1 and SL2, respectively. Switch fabric 902 is a well-known programmable interconnect structure that selectively routes data and other signals between various PLD resources. For other embodiments, portions of switch fabric 902 may be implemented in one or more programmable logic blocks, for example, as depicted in the embodiments of FIG. 4.

As described above, embodiments of the present invention may be used to isolate disabled programmable logic blocks from enabled programmable logic blocks, thereby preventing the transmission of invalid data signals from disabled programmable logic blocks to enabled programmable logic blocks. Because configuration data for the programmable logic blocks of a PLD are usually stored in volatile configuration memory cells associated with the programmable logic blocks, when a programmable logic block is disabled (e.g., disconnected from VDD), its configuration data is lost. Thus, if the disabled programmable logic block is subsequently re-enabled, it needs to be re-configured with the appropriate configuration data, which typically requires initiating a re-configuration operation in which configuration data is loaded from an external memory device into the configuration memory cells associated with the re-enabled programmable logic block.

Figure 10:
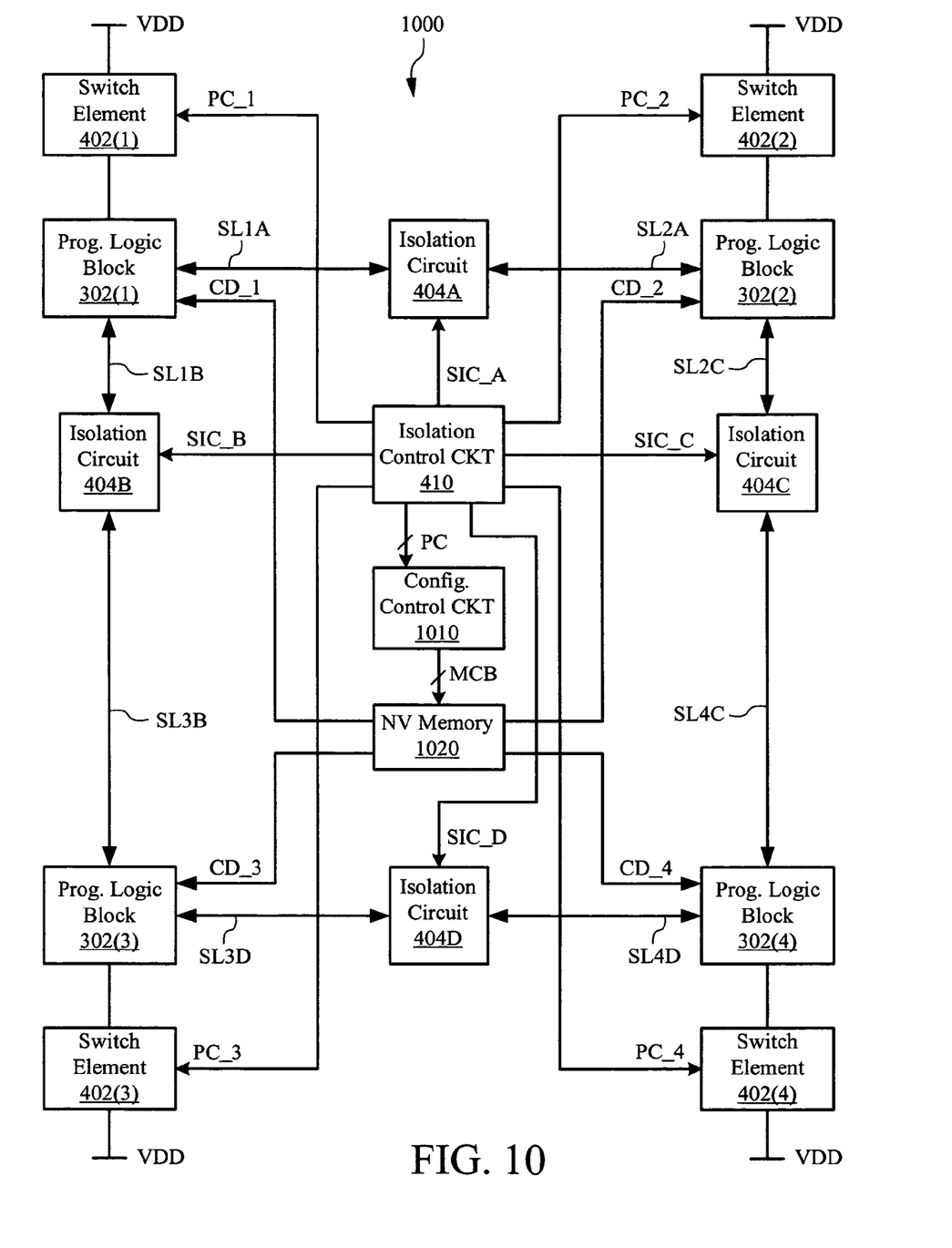
FIG. 10 is a block diagram of a PLD in accordance with another embodiment of the present invention.

However, for PLDs that include non-volatile memory to store configuration data for their programmable logic blocks, embodiments of the present invention may be used to trigger on-chip re-configuration of one or more programmable logic blocks that have been disabled and subsequently re-enabled. For example, FIG. 10 shows a PLD 1000 that is another embodiment of the present invention. PLD 1000 includes all the elements of PLD 400 of FIG. 4, and also includes a configuration control circuit 1010 and a non-volatile memory 1020. For simplicity, voltage supply 304 is not shown in FIG. 10. Configuration control circuit 1010 includes inputs to receive the power control signals (PC) from isolation control circuit 410, and includes outputs to provide memory control bits (MCB) to non-volatile memory 1020. For simplicity, the PC and MCB signals associated with configuration control circuit 1010 are represented collectively in FIG. 10.

Memory element 1020, which may be any suitable non-volatile memory device such as, for example, PROM, EPROM, EEPROM, or Flash memory, is configured to store configuration data for programmable logic blocks 302(1)-302(4). The configuration data may be provided to memory element 1020 from an external source (not shown for simplicity) in a well-known manner during initial configuration of PLD 1000. Memory element 1020 includes outputs to selectively provide portions CD_1 to CD_4 of the configuration data to respective programmable logic blocks 302(1)-302(4) in response to corresponding MCB signals, which as described below may be used to facilitate the re-configuration of one or more programmable logic blocks 302 that have been disabled and subsequently re-enabled by isolation control circuit 410.

Figure 11:
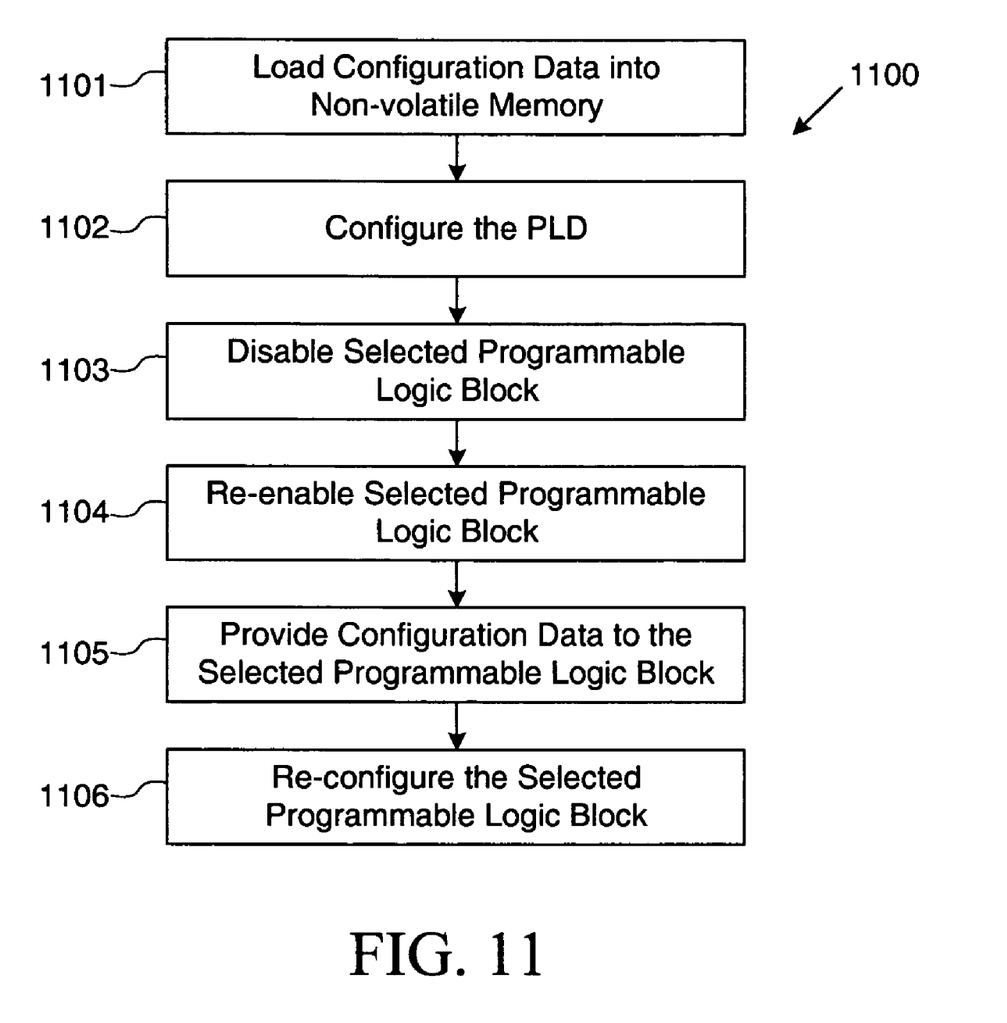
FIG. 11 is a flow diagram illustrating an exemplary re-configuration operation of one embodiment of the PLD of FIG. 10.

An exemplary re-configuration operation of a disabled programmable logic block of PLD 1000 is described below with respect to the flow diagram of FIG. 11. First, configuration data is provided (e.g., from an external source) to PLD 1000 and stored in non-volatile memory 1020 in a well-known manner (1101). Then, the PLD is configured in a well-known manner using the configuration data stored in non-volatile memory 1020 (1102). For other embodiments, the configuration data may also be stored in volatile configuration memory cells associated with corresponding programmable logic blocks 302. Then, a selected programmable logic block 302 is disabled, for example, by de-asserting its corresponding power control signal PC (1103). Subsequently, the selected programmable logic block 302 is re-enabled, for example, by re-asserting its corresponding power control signal PC (1104). In response to the re-assertion of the PC signal, configuration control circuit 1010 causes memory element 1020 to provide a corresponding portion of the configuration data to the selected programmable logic block 302 (1105). After receiving the configuration data from memory element 1020, the selected programmable logic block 302 is re-configured to implement a design embodied by the configuration data (1106).

For some embodiments, configuration control circuit 1010 may be configured to assert an MCB signal in response to detecting the re-assertion of a corresponding power control signal PC, and memory element 1020 may be configured to read out a corresponding portion of the configuration data to the re-enabled programmable logic block in response to the asserted MCB signal. For one embodiment, configuration control circuit 1010 may employ positive edge triggered latches to assert the MCB signals in response to the detection of logic low to logic high transitions of corresponding PC signals, although for other embodiments other suitable detection circuitry may be used. The MCB signals may then be used to instruct memory element 1020 to output a portion of the configuration data identified by the asserted MCB signal to the selected (e.g., re-enabled) programmable logic block 302, which in turn is re-configured using the configuration data provided by memory element 1020. Thus, for the exemplary embodiment described herein, the asserted MCB signal may be used to address a corresponding portion of the configuration data stored in memory element 1020, and may also be used as a select signal to route the addressed configuration data from memory element 1020 to the corresponding programmable logic block.

For other embodiments, configuration control circuit 1010 may assert the MCB signals in response to the signal isolation control signals SIC. For example, for embodiments in which each programmable logic block 302 is selectively connected to the PLD switch fabric by a corresponding signal isolation circuit 402, as described above with respect to FIG. 9, configuration control circuit 1010 may assert an MCB signal if a corresponding SIC signal has been de-asserted and subsequently re-asserted to re-connect a selected programmable logic block 302 to the switch fabric, whereby assertion of the MCB signal causes memory element 1020 to output appropriate configuration data to the selected programmable logic block 302.

By allowing disabled programmable logic blocks that have been subsequently re-enabled to be re-configured using configuration data stored in memory element 1020, embodiments of PLD 1000 eliminate the need to download configuration data from an external source when a disabled programmable logic block is re-enabled, which in turn may reduce the time required for re-configuration operations of the disabled programmable logic block(s).

Because configuration control circuit 1010 and memory element 1020 may be implemented using various well-known circuit elements to perform their respective functions described herein, specific implementations of configuration control circuit 1010 and memory element 1020 are not disclosed herein for brevity. Further, although described herein as being independent of programmable logic blocks 302, for other embodiments, configuration control circuit 1010 and/or memory element 1020 may be implemented within a selected one of programmable logic blocks 302.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A programmable logic device, comprising:
a plurality of programmable logic blocks, each comprising one or more programmable resources of the programmable logic device;
a plurality of switch elements, each switch element coupled between a power rail of a voltage supply and a programmable logic block of the plurality of programmable logic blocks to enable selectively coupling the voltage supply to the programmable logic block;
a number of signal isolation circuits, each having a first terminal coupled to an output signal line of a first corresponding programmable logic block; and
an isolation control circuit coupled to the signal isolation circuits, the isolation control circuit isolating the first corresponding programmable logic block by controlling the number of signal isolation circuits when a switch element decouples the voltage supply from the first corresponding programmable logic block.

2. The programmable logic device of claim 1, wherein each signal isolation circuit is configured to selectively isolate the first corresponding programmable logic block from other components of the programmable logic device.

3. The programmable logic device of claim 1, wherein the isolation control circuit is configured to generate first control signals for controlling the signal isolation circuits.

4. The programmable logic device of claim 3, wherein each signal isolation circuit is configured to selectively prevent transmission of logic signals from the first corresponding programmable logic block.

5. The programmable logic device of claim 4, wherein the signal isolation circuit is configured to selectively force the logic signals to a predetermined state.

6. The programmable logic device of claim 4, wherein the signal isolation circuit is configured to selectively store the logic states of the logic signals.

7. The programmable logic device of claim 3, wherein the isolation control circuit comprises a number of memory cells for storing the first control signals.

8. The programmable logic device of claim 3, wherein the isolation control circuit comprises a number of inputs to receive the first control signals.

9. The programmable logic device of claim 1, wherein the isolation control circuit comprises one or more of the programmable resources in a selected programmable logic block.

10. The programmable logic device of claim 1, wherein each signal isolation circuit further comprises a second terminal coupled to an input signal line of another component of the programmable logic device.

11. The programmable logic device of claim 10, wherein the other component comprises a switch fabric of the programmable logic device.

12. The programmable logic device of claim 10, wherein the other component comprises a second corresponding programmable logic block.

13. The programmable logic device of claim 10, wherein each signal isolation circuit comprises:
a pass transistor having a first terminal coupled to the output signal line of the first corresponding programmable logic block, a second terminal coupled to the input signal line of the other component, and a gate to receive a corresponding first control signal from the isolation control circuit.

14. The programmable logic device of claim 13, wherein the signal isolation circuit further comprises:
a first latch coupled to the input signal line, the first latch for storing a logic state of a signal on the input signal line.

15. The programmable logic device of claim 14, wherein the signal isolation circuit further comprises:
a second latch coupled to the output signal line, the second latch for storing a logic state of a signal on the output signal line.

16. The programmable logic device of claim 13, wherein the signal isolation circuit further comprises:
a first pull-down transistor connected between the input signal line and ground potential and having a gate responsive to the first control signal.

17. The programmable logic device of claim 16, wherein the signal isolation circuit further comprises:
a second pull-down transistor connected between the output signal line and ground potential and having a gate responsive to the first control signal.

18. The programmable logic device of claim 1, further comprising:
a non-volatile memory for storing configuration data for the programmable logic blocks; and
a configuration control circuit having inputs coupled to the isolation control circuit and having outputs coupled to the non-volatile memory.

19. The programmable logic device of claim 18, wherein the non-volatile memory selectively provides appropriate portions of the configuration data to corresponding programmable logic blocks in response to corresponding memory control signals generated by the configuration control circuit.

20. The programmable logic device of claim 1, further comprising:
a voltage supply terminal configured to receive a supply voltage;
wherein each switch element of the plurality of switch elements has a control terminal to receive a corresponding second control signal from the isolation control circuit.

21. The programmable logic device of claim 20, wherein each switch element selectively couples a corresponding programmable logic device to the supply voltage in response to the corresponding second control signal.

22. A programmable logic device, comprising:
a plurality of programmable logic blocks, each programmable logic block comprising one or more resources of the programmable logic device and having at least one signal line configured to exchange a data signal with another component of the programmable logic device;
means for selectively disabling one or more of the programmable logic blocks; and
means for selectively isolating each disabled programmable logic block from the other components of the programmable logic device,
wherein the means for selectively isolating stores the logic states of one or more input signals to the other component.

23. The programmable logic device of claim 22, wherein the means for selectively disabling is responsive to one or more power control signals, and the means for selectively isolating is responsive to one or more isolation control signals.

24. The programmable logic device of claim 23, further comprising:
means for generating the power control signals and the isolation control signals.

25. The programmable logic device of claim 23, further comprising:
a plurality of configuration memory cells for storing the power control signals and the isolation control signals.

26. The programmable logic device of claim 25, wherein the power control signals and the isolation control signals are provided to one or more input pads of the device.

27. The programmable logic device of claim 22, wherein the means for selectively isolating forces one or more input signals to the other component to a predetermined state.

28. The programmable logic device of claim 22, wherein the other component comprises a switch fabric of the programmable logic device.

29. The programmable logic device of claim 22, wherein the other component comprises another programmable logic block.

30. The programmable logic device of claim 23, further comprising:
means for storing configuration data for the programmable logic blocks; and
means for selectively re-configuring the disabled programmable logic blocks with the configuration data.

31. The programmable logic device of claim 30, wherein the means for selectively re-configuring is responsive to the power control signals.

32. The programmable logic device of claim 30, wherein the means for selectively re-configuring is responsive to the isolation control signals.

33. A method of operating a programmable logic device having a plurality of programmable logic blocks, each including one or more programmable resources of the programmable logic device and having a signal line coupled to another component of the programmable logic device, the method comprising:
generating one or more isolation control signals; and
selectively isolating the signal line of one or more programmable logic blocks from the other component in response to the isolation control signals; and
saving a logic state on an input signal line of the other component.

34. The method of claim 33, wherein the selectively isolating comprises:
turning off a pass transistor connected between the signal line of the programmable logic block and the other component.

35. The method of claim 33, wherein the selectively isolating comprises:
forcing an input data signal to the other component to a predetermined logic state.

36. The method of claim 33, further comprising:
extracting the isolation control signals from a configuration bitstream.

37. A method of operating a programmable logic device having a plurality of programmable logic blocks, each including one or more programmable resources of the programmable logic device and having a signal line coupled to another component of the programmable logic device, the method comprising:
providing, for each programmable logic block of a plurality of programmable logic blocks, an isolation circuit between a programmable logic block and each component of a plurality of components coupled to the programmable logic block;

selectively disabling one or more of the programmable logic blocks by disconnecting the disabled programmable logic blocks from a voltage supply in response to corresponding power control signals; and selectively isolating the signal lines of the disabled programmable logic blocks from the other components by way of the isolation circuits provided for the disabled programmable logic blocks.

38. The method of claim 37, further comprising:

generating one or more power control signals to control the selectively disabling; and generating one or more isolation control signals to control the selectively isolating.

39. The method of claim 37, further comprising:

storing configuration data for the programmable logic blocks in a non-volatile memory disposed within the programmable logic device; and re-configuring the disabled programmable logic blocks with corresponding portions of the configuration data.

40. The method of claim 39, wherein the disabled programmable logic blocks are re-configured in response to corresponding power control signals.

41. The method of claim 39, wherein the disabled programmable logic blocks are re-configured in response to corresponding isolation control signals.

* * * * *